(12) United States Patent
Ghafari et al.

(10) Patent No.: US 11,904,959 B2
(45) Date of Patent: Feb. 20, 2024

(54) DETECTING WATER INGRESS IN ELECTRONIC POWER STEERING SYSTEMS

(71) Applicant: ZF Active Safety and Electronics US LLC, Livonia, MI (US)

(72) Inventors: Abraham Ghafari, Rochester Hills, MI (US); Mohammad Ashraf Ali, Macomb (IN)

(73) Assignee: ZF Active Safety and Electronics US LLC, Livonia, MI (US)

( * ) Notice: Subject to any disclaimer, the term of this patent is extended or adjusted under 35 U.S.C. 154(b) by 222 days.

(21) Appl. No.: 17/496,032

(22) Filed: Oct. 7, 2021

(65) Prior Publication Data

US 2023/0110917 A1 Apr. 13, 2023

(51) Int. Cl.
*B62D 5/04* (2006.01)
*G01N 27/22* (2006.01)
*H03H 1/02* (2006.01)
*H03F 3/45* (2006.01)

(52) U.S. Cl.
CPC .......... *B62D 5/0481* (2013.01); *G01N 27/223* (2013.01); *H03H 1/02* (2013.01); *H03F 3/45* (2013.01); *H03F 2200/102* (2013.01)

(58) Field of Classification Search
CPC ...... B62D 5/0481; G01N 27/223; H03H 1/02; H03F 3/45; H03F 2200/102
See application file for complete search history.

(56) References Cited

U.S. PATENT DOCUMENTS

| 4,259,632 A * | 3/1981 | Ahtiainen | G01N 27/223 73/73 |
| 2005/0087620 A1* | 4/2005 | Bowers | A01G 25/167 239/63 |
| 2010/0109635 A1* | 5/2010 | Gotz | G01N 27/223 324/71.1 |
| 2020/0025964 A1* | 1/2020 | Kubo | G01D 5/24 |
| 2020/0094498 A1* | 3/2020 | Lobo Casanova | B29C 70/50 |

FOREIGN PATENT DOCUMENTS

| DE | 102004063228 A1 | 7/2006 |
| WO | 1994/08247 A1 | 4/1994 |

OTHER PUBLICATIONS

German Search Report for corresponding German Serial No. 10 2022 209 758.0, dated May 22, 2023, pp. 1-12.

* cited by examiner

*Primary Examiner* — Jermele M Hollington
*Assistant Examiner* — Zannatul Ferdous
(74) *Attorney, Agent, or Firm* — Robert James Harwood

(57) ABSTRACT

Systems and methods are provided for detecting water within an electronic power steering assembly. A sensor assembly includes a resistor and a water-sensitive capacitor arranged to provide a series resistor-capacitor (RC) network having a cut-off frequency that is a function of a capacitance of the water-sensitive capacitor. An oscillator provides an excitation to the series RC network having a known frequency, such that the series RC network provides an output in response to the excitation. An envelope detector receives the output of the series RC network and generates an output representing an amplitude of the output of the series RC network. A microcontroller determines if water is present within the electronic power steering assembly from the amplitude of the output of the series RC network.

17 Claims, 4 Drawing Sheets

DETECTING WATER INGRESS IN ELECTRONIC POWER STEERING SYSTEMS

TECHNICAL FIELD

This invention relates to automotive systems, and more particularly, to detecting water ingress in electronic power steering systems.

BACKGROUND

In motor vehicles, a power steering system helps drivers steer the vehicle by augmenting steering effort needed to turn the steering wheel, making it easier for the vehicle to turn or maneuver. Hydraulic or electric actuators add controlled energy to the steering mechanism, allowing the driver turn the steered wheels when driving at typical speeds with less effort, and reduce considerably the physical effort necessary to turn the wheels when a vehicle is stopped or moving slowly. Electric power steering (EPS) systems use electric motors to provide the assistance, with power to the motor controlled by the rest of the power steering system. Water ingress into EPS systems, specifically into a screw/ball nut assembly driven by the electric motor, can lead to increase in system friction. The increase in system friction can lead to a hazardous vehicle condition if the increase in friction levels is undetected by the driver or the EPS system and the EPS system transitions to its manual fail-safe steering state. The increase in friction can be tracked directly, but the methods for doing so are both time-consuming, as they require extensive tuning and testing, and lack robustness to vehicle and road conditions.

SUMMARY

In accordance with one aspect of the present invention, a system is provided for detecting water within an electronic power steering assembly. A sensor assembly includes a resistor and a water-sensitive capacitor arranged to provide a series resistor-capacitor (RC) network having a cut-off frequency that is a function of a capacitance of the water-sensitive capacitor. An oscillator provides the excitation to the series RC network having a known range of cutoff frequency, such that the series RC network provides an output in response to the excitation signal and the amount of water present on the sense capacitor. An envelope detector receives the output of the series RC network and generates a DC voltage representing an amplitude of the output of the series RC network. A microcontroller determines if water is present within the electronic power steering assembly from the amplitude of the output of the envelope detector and the parallel RC network.

In accordance with a second aspect of the present invention, a method is provided. The water sensitive capacitor is designed into an electronic circuit that generates an output in response to the change in capacitance. Such electronic circuits include, but not limited to, relaxation oscillators and phase detectors. From the output of the electronic circuit, an output representing the change in capacitance is generated, an it is determined if water is present within the electronic power steering system.

In accordance with a third aspect of the present invention, a method is provided. A second sensor maybe positioned within the electronic power steering system. The second sensor may include diverse electronic circuits compared to the first sensor and may be used as a reference sensor when the capacitive sensor is isolated from water intrusion.

BRIEF DESCRIPTION OF THE DRAWINGS

The foregoing and other features of the present disclosure will become apparent to those skilled in the art to which the present disclosure relates upon reading the following description with reference to the accompanying drawings, in which.

DETAILED DESCRIPTION

In the context of the present disclosure, the singular forms "a," "an" and "the" can also include the plural forms, unless the context clearly indicates otherwise. The terms "comprises" and/or "comprising," as used herein, can specify the presence of stated features, steps, operations, elements, and/or components, but do not preclude the presence or addition of one or more other features, steps, operations, elements, components, and/or groups.

As used herein, the term "and/or" can include any and all combinations of one or more of the associated listed items.

A "water-sensitive capacitor," as used herein, is a capacitor having a capacitance that varies in the presence of water. The design of these capacitors can vary, but in general, a water-sensitive capacitor experiences an increase in capacitance when water displaces another substance between the conductive surfaces of the capacitor having a lower relative permittivity, such as air.

Additionally, although the terms "first," "second," etc. may be used herein to describe various elements, these elements should not be limited by these terms. These terms are only used to distinguish one element from another. Thus, a "first" element discussed below could also be termed a "second" element without departing from the teachings of the present disclosure. The sequence of operations (or acts/steps) is not limited to the order presented in the claims or figures unless specifically indicated otherwise.

As used herein, the term "substantially identical" or "substantially equal" refers to articles or metrics that are identical other than manufacturing or calibration tolerances.

A location on or within a vehicle is "lower" than another location when, during normal operation of the vehicle, it is located closer to the ground than another location.

Figure 1:
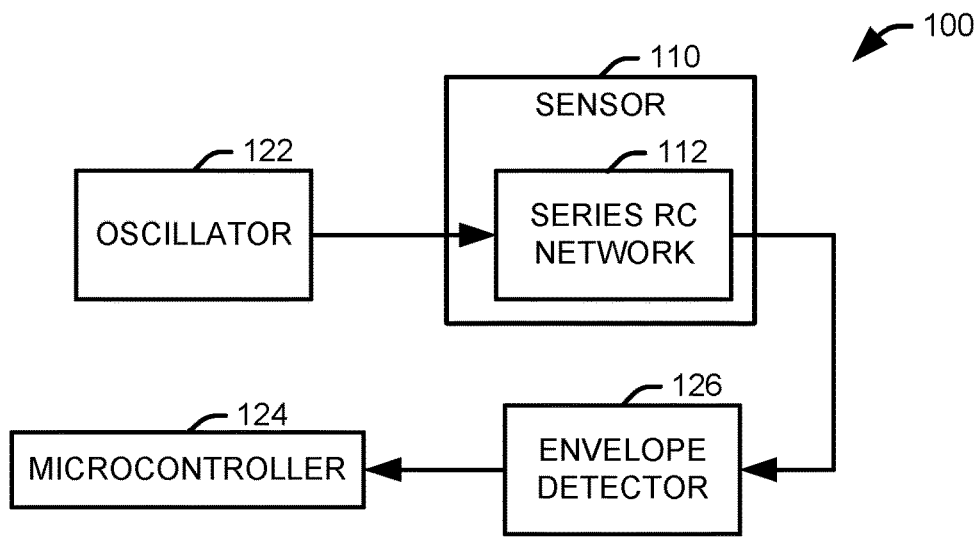
FIG. 1 illustrates one example of a system for detecting water within an electronic power steering assembly.

FIG. 1 illustrates one example of a system 100 for detecting water within an electronic power steering assembly. A sensor assembly 110 comprising a resistor and a water-sensitive capacitor arranged to provide a series resistor-capacitor (RC) network 112. The series RC network 112 has a cut-off frequency that is a function of a capacitance of the water-sensitive capacitor. In general, the water-sensitive capacitor will have an initial capacitance when dry that increases to a maximum value as increasing amounts of water are present at the capacitor. As a result, the cut-off frequency of the series RC network starts as a first value, when the capacitor is dry and decreases toward a minimum second value as the capacitor becomes saturated. In one example, the first value is between five and fifteen times greater than the second value. The sensor assembly 110 can be located at a lowest point in an internal cavity of a ball nut assembly associated with the electronic power steering assembly. It will be appreciated that multiple sensor assemblies (not shown) can be positioned at various locations within the electronic power steering assembly to detect the ingress of water over multiple locations.

Figure 2:
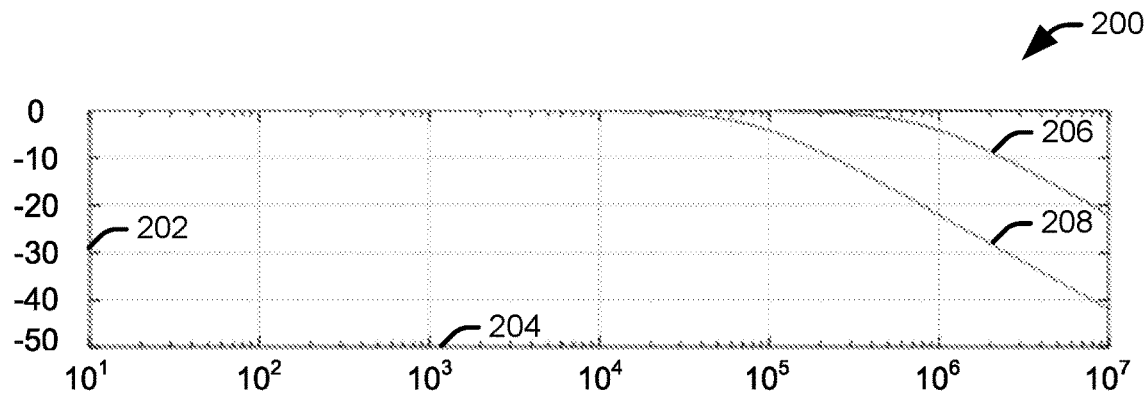
FIG. 2 illustrates a gain frequency response of an RC network in a water sensor having a variable capacitance based on the presence of water on a capacitive element.

FIG. 2 illustrates a gain frequency response 200 of an RC network in a water sensor having a variable capacitance based on the presence of water at a capacitive element. A vertical axis 202 represents a gain of the RC network in decibels, and a horizontal axis 204 represents a frequency of an input signal in hertz on a logarithmic scale. A first plot 206 represents the gain of the RC network when the sensor is dry. It will be appreciated that a range for the cut-off frequency of the RC network can be selected according to a given application. In the illustrated example, when the sensor is dry, the cut-off range is approximately one megahertz. A second plot 208 represents the gain of the RC network when water is present at the sensor. In the illustrated example, the sensor is designed such that a capacitance of the capacitor in the RC network increases by approximately a factor of ten when water is present at the sensor, and the cut-off frequency is reduced to about approximately one hundred kilohertz. According, a difference in the gain can be noted for a range of frequencies starting around the cutoff frequency of the second plot 208, with a maximum difference between the two gains of about twenty decibels reached about a decade later.

Returning to FIG. 1, an oscillator 122 provides an excitation to the series RC network having a known frequency selected to provide an output at the RC network that can be used to determine the presence of water at the water-sensitive capacitor. In the illustrated example, the cut-off frequency varies with the presence of water between a minimum frequency, representing the situation in which the capacitance of the capacitor is maximum due to the presence of water, and a maximum cut-off frequency, representing the situation in which no water is present at the sensor assembly. In one example, the maximum cut-off frequency is between five and fifteen times the minimum cut-off frequency. To this end, the known frequency can be selected to be greater than the minimum cut-off frequency of the series RC network 112 such that a gain of the series RC network is reduced when water is present at the sensor assembly 110.

Alternatively, since the range for the cut-off frequency of the series RC network 112 can be configured such that a difference between a first gain of the series RC network when no water is present at the water-sensitive capacitor and a second gain of the series RC network when water is present at the water-sensitive capacitor is maximized at the frequency of the excitation. In the illustrated example, the oscillator 122 is located with the sensor assembly 110, although it will be appreciated that the oscillator could also be located remotely, for example, at a microcontroller 124 associated with the electronic power steering assembly.

An envelope detector 126 receives the output of the series RC network 112 and generates an output representing an amplitude of the output of the series RC network. In one implementation, the envelope detector 126 is implemented as a peak detector circuit that removes the alternating current (AC) component of the output of the series RC network 112. The output of the envelope detector 126 can be provided to the microcontroller 124, which determines if water is present within the electronic power steering assembly from the amplitude of the output of the series RC network 112. In one example, the output of the envelope detector 126 is provided to an analog-to-digital converter (ADC) at the microcontroller 124, and the resulting digital signal is provided to decision logic. The decision logic can be implemented, for example, as software or firmware at the microcontroller 124 or as a separate hardware assembly operatively connected to the microcontroller, such as a field programmable gate array (FPGA) or an application specific integrated circuit. The decision logic can range from a straightforward thresholding process, indicating the ingress of water if the digital signal ever drops below a threshold, or more complex decision logic in which a windowed average of the digital signal is compared to a static or dynamic threshold. In one implementation, a dynamic threshold can be derived from a reference circuit (not shown) including a series RC circuit with a capacitor that is protected from ingress of water.

Figure 3:
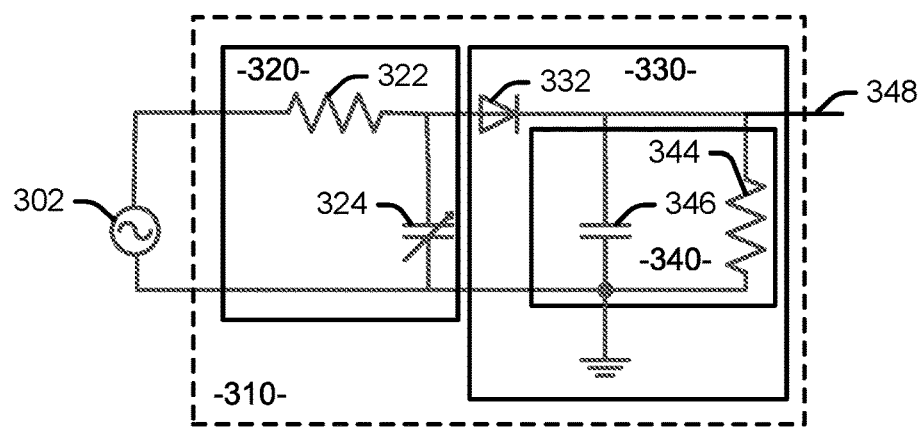
FIG. 3 illustrates an example of an assembly for detecting the ingress of water into an electronic power steering assembly.

FIG. 3 illustrates an example of an assembly 300 for detecting the ingress of water into an electronic power steering assembly. The assembly includes an oscillator 302 that provides an excitation having a known frequency to a water-sensitive circuit 310. In the illustrated implementation, the oscillator 302 is shown as being remote from the water-sensitive circuit 310 but it will be appreciated that the oscillator 302 can instead be implemented at or near the water-sensitive circuit. The water-sensitive circuit 310 includes a series RC circuit 320 that includes a first resistor 322 and a water-sensitive capacitor 324. The resistance of the resistor 322 and the range of capacitance associated with the water-sensitive capacitor 324 can be selected to provide a range of cut-off frequencies for the series RC circuit. An envelope detector 330 includes a diode 342 connected to a parallel RC circuit 340 comprising a second resistor 344 and a capacitor 346 having a substantially fixed capacitance. The envelope detector 330 is configured to remove the AC component of the voltage, such that an output 348 of the water-sensitive circuit 310 represents the presence or absence of water in the electronic power steering assembly.

Figure 4:
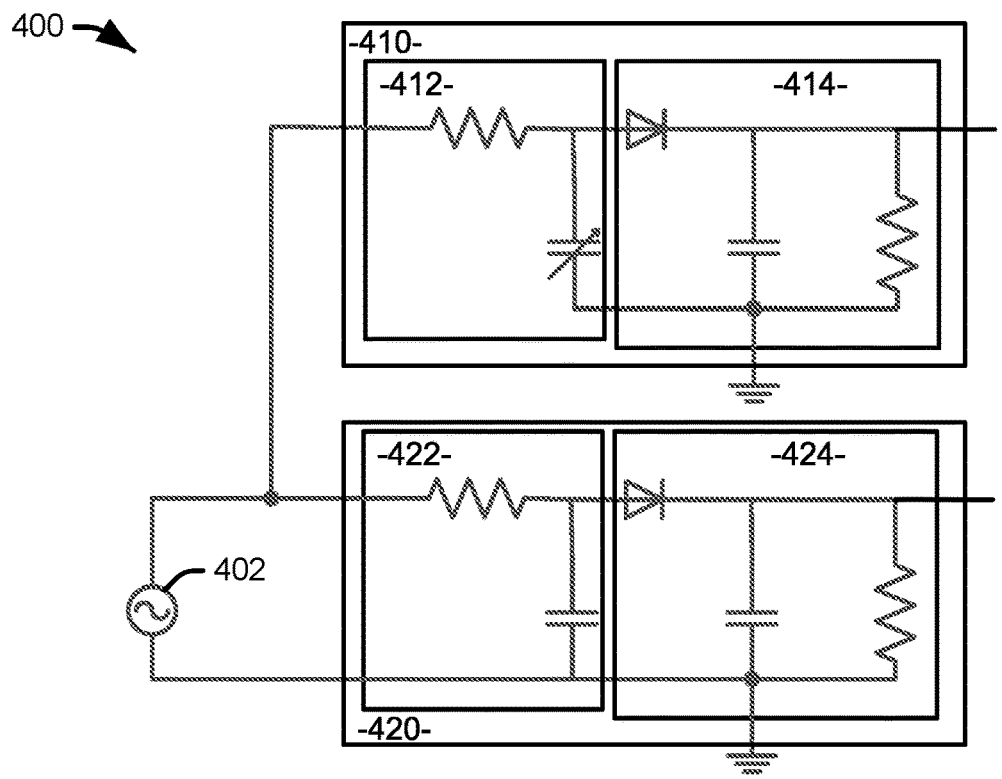
FIG. 4 illustrates another example of an assembly for detecting the ingress of water into an electronic power steering assembly.

FIG. 4 illustrates another example of an assembly 400 for detecting the ingress of water into an electronic power steering assembly. The assembly includes an oscillator 402 that provides an excitation having a known frequency to a water-sensitive circuit 410 and a reference circuit 420. The water-sensitive circuit 410 includes a series RC circuit 412 that includes a first resistor and a water-sensitive capacitor. The resistance of the resistor and the range of capacitance associated with the water-sensitive capacitor can be selected to provide a range of cut-off frequencies for the series RC circuit. An envelope detector 414 includes a diode connected to a parallel RC circuit comprising a second resistor and a capacitor having a substantially fixed capacitance. The envelope detector 414 is configured to remove the AC component of the voltage, such that an output of the water-sensitive circuit represents the presence or absence of water in the electronic power steering assembly.

The reference circuit 420 is designed to mimic the function of the water-sensitive circuit without the variable, water-sensitive capacitor in the series RC circuit. To this end, the reference circuit 420 includes a series RC circuit 422 that includes a first resistor and a first capacitor having a substantially fixed resistance. The resistance of the resistor and the capacitance of the capacitor are selected to provide a cut-off frequency for the series RC circuit 422 substantially equal to the cut-off frequency of the series RC circuit 412 of the water-sensitive circuit when no water is present at the sensor. As with the water-sensitive circuit, an envelope detector 424 is configured to remove the AC component of the voltage. The envelope detector 424 includes a diode connected to a parallel RC circuit comprising a second resistor and a capacitor having a substantially fixed capacitance.

The resistance and capacitance associated with the series RC network 424 of the reference circuit are not expected to change significantly during operation, and any change in the gain for the circuit is likely to be caused by variations in the oscillator 402 or another factor unrelated to the presence of water within the electronic power steering system. Accordingly, the output of the reference circuit 420 can be monitored, for example, via appropriate decision logic, to determine if the system 400 is operating properly. In some implementations, a difference between the output of the water-sensitive circuit 410 and the reference circuit 420 can be determined, for example, at a difference amplifier (not shown) and used for both monitoring the system 400 for error and to determine if water is present within the electronic power steering assembly.

Figure 5:
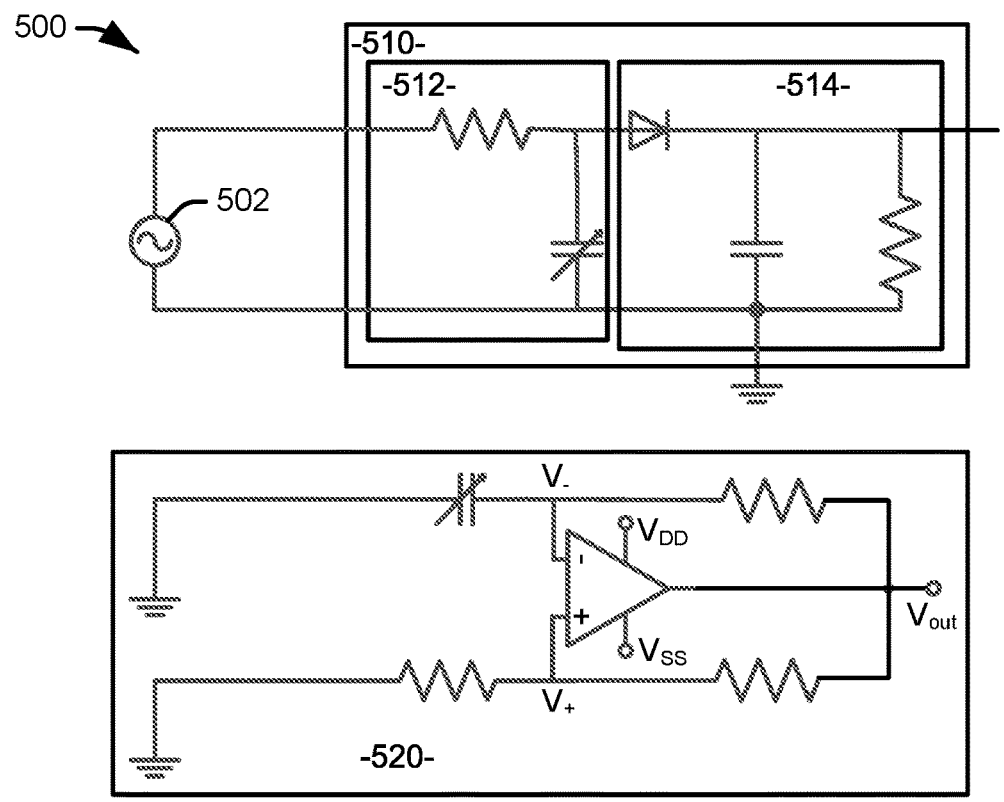
FIG. 5 illustrates another example of an assembly for detecting the ingress of water into an electronic power steering assembly.

FIG. 5 illustrates another example of an assembly 500 for detecting the ingress of water into an electronic power steering assembly. The assembly includes a first oscillator 502 that provides an excitation having a first frequency to a first water-sensitive circuit 510 and a second oscillator 504 that provides an excitation having a second frequency that is different from the first frequency to a second water-sensitive circuit 520. The first water-sensitive circuit 510 includes a first series RC circuit 512 that includes a first resistor and a first water-sensitive capacitor. Each of the resistance of the first resistor and the range of capacitance associated with the first water-sensitive capacitor can be selected to provide a first range of cut-off frequencies for the series RC circuit. It will be appreciated that the first frequency can be selected to be within the first range of cut-off frequencies. A first envelope detector 514 includes a diode connected to a parallel RC circuit comprising a second resistor and a capacitor having a substantially fixed capacitance. The envelope detector 514 is configured to remove the AC component of the voltage, such that an output of the first water-sensitive circuit represents the presence or absence of water in the electronic power steering assembly at a location associated with the first water-sensitive circuit.

The second water-sensitive circuit 520 includes a second resistor 522, a third resistor 524, and a fourth resistor 526 and a second water-sensitive capacitor 528. An operational amplifier 530 is connected to a node between the second resistor 522 and the water-sensitive capacitor 528 to provide a first input, and a node between the third resistor 524 and the fourth resistor 526 to provide a second input. Each of the resistance of the resistors 522, 524, and 526 and the range of capacitance associated with the second water-sensitive capacitor 528 can be selected to provide a range of oscillation frequencies for the second water-sensitive circuit 520. When the water-sensitive capacitor 528 is dry the oscillation frequency is a first frequency, but in the presence of water at the second water-sensitive capacitor, the capacitance of the second water-sensitive capacitor increases, and the frequency of the oscillation decreases. The outputs of each of the first water-sensitive circuit 510 and the second water-sensitive circuit 520 can be provided to a microprocessor (not shown) for a determination of the presence of water in the electronic power steering assembly from the amplitude of the outputs.

Figure 6:
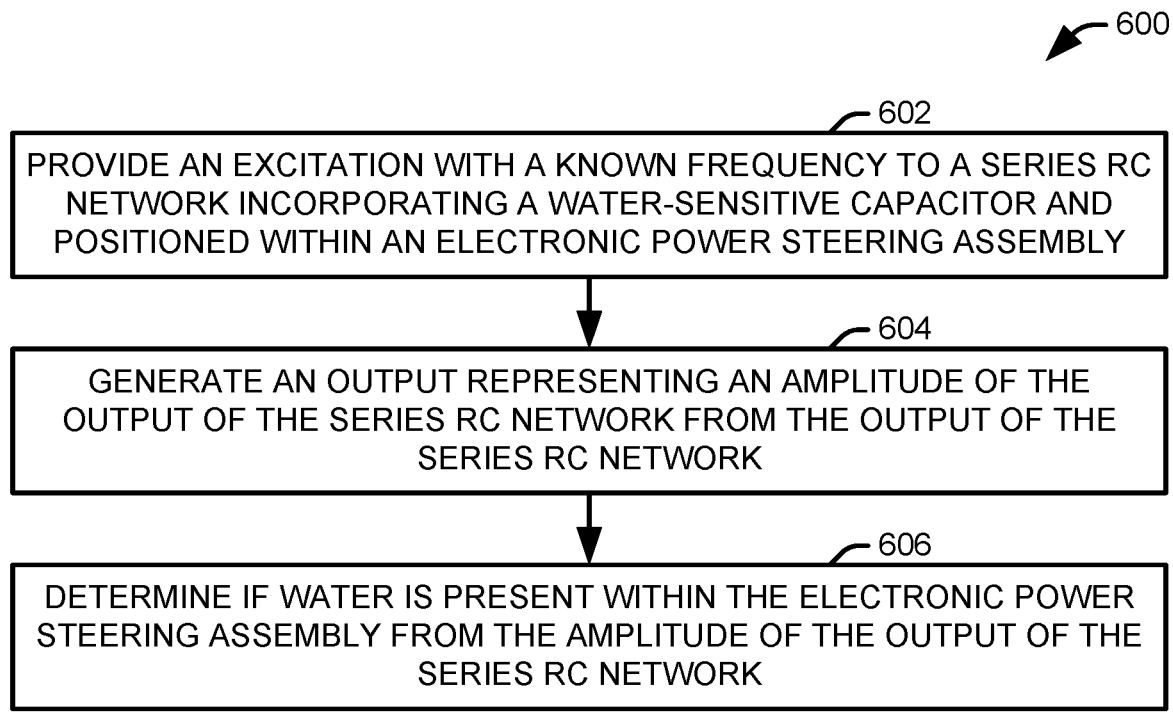
FIG. 6 illustrates a method for detecting ingress of water in an electronic power steering assembly.
Figure 7:
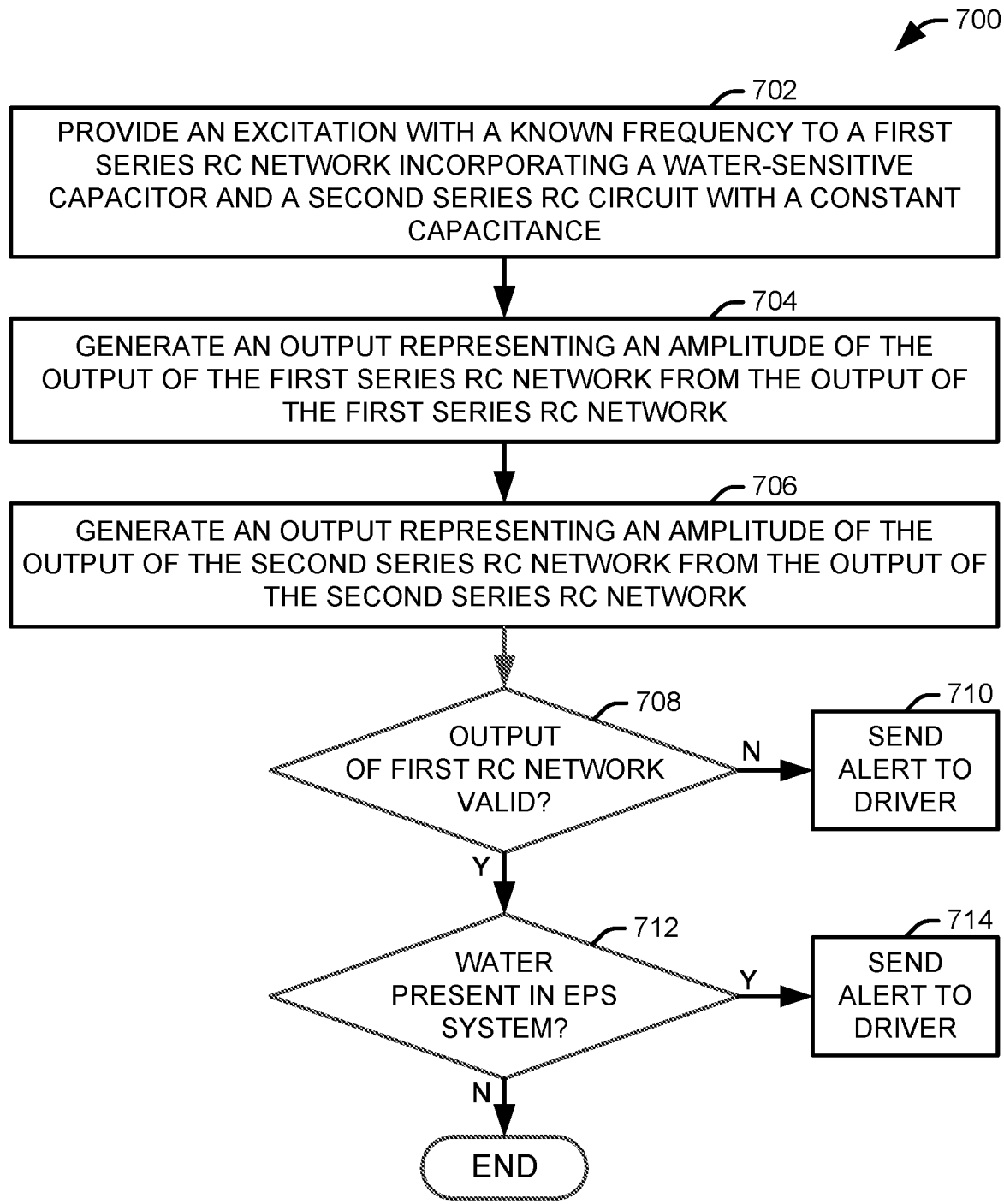
FIG. 7 illustrates another method for detecting ingress of water in an electronic power steering assembly.

In view of the foregoing structural and functional features described above, example methods will be better appreciated with reference to FIGS. 6 and 7. While, for purposes of simplicity of explanation, the example methods of FIGS. 6 and 7 are shown and described as executing serially, it is to be understood and appreciated that the present examples are not limited by the illustrated order, as some actions could in other examples occur in different orders, multiple times and/or concurrently from that shown and described herein. Moreover, it is not necessary that all described actions be performed to implement a method.

FIG. 6 illustrates a method 600 for detecting ingress of water in an electronic power steering assembly. At 602, an excitation, having a known frequency, is provided to a series RC network positioned within the electronic power steering assembly. The series RC network includes a water-sensitive capacitor and provides an output representing the presence or absence of water in the electronic power steering assembly in response to the excitation. In one implementation, the series RC network is configured such that a cut-off frequency of the series RC network is less than the known frequency of the excitation when no water is present at the water-sensitive capacitor. In another implementation, the series RC network is configured such that the cut-off frequency of the series RC network is greater than the known frequency of the excitation when no water is present at the water-sensitive capacitor and less than the known frequency of the excitation when water is present at the water-sensitive capacitor.

At 604, an output representing an amplitude of the output of the series RC network is generated from the output of the series RC network. In one example, the output of the series RC network is provided to a peak detector to remove the AC component of the output and then converted to a digital signal at an analog-to-digital converter. At 606, it is determined if water is present within the electronic power steering assembly from the amplitude of the output of the series RC network. For example, the amplitude can be compared to a threshold value to determine if a gain of the series RC network has been reduced by the presence of water. More complicated decision logic can also be used, for example, tracking a windowed average of the amplitude and comparing the calculated average to a dynamic or static threshold. A driver can be notified, for example, via either or both of a visible or audible alert, if it is determined if water is present within the electronic power steering assembly.

FIG. 7 illustrates another method 700 for detecting ingress of water in an electronic power steering assembly. At 702, an excitation, having a known frequency, is provided to first and second series RC networks. The first series RC network includes a water-sensitive capacitor and is positioned within the electronic power steering assembly. The second series RC network has a capacitance that is substantially constant. Each of the first series RC network and the second series RC network providing respective outputs in response to the excitation. At 704, an output representing an amplitude of the output of the first series RC network is generated from the output of the first series RC network, for example, via a peak detection circuit. At 706, an output representing an amplitude of the output of the second series RC network is generated from the output of the second series RC network, for example, via a peak detection circuit.

At 708, is determined if the output of the first series RC network is valid from the output of the second series RC network. The resistance and capacitance associated with the second series RC network are substantially constant, and thus the expected gain for the circuit, are expected to remain substantially constant, and thus any significant variations in the output of the second series RC network are likely to be caused by variations in the oscillator used to provide the excitation or another factor unrelated to the presence of water within the electronic power steering system. Accordingly, decision logic can be employed to monitor the output of the second series RC network to determine if the output of the first series RC network is being affected by other factors. If the result is determined to be invalid (N), an alert can be provided to the driver at 710. Otherwise, the method advances to 712, where it is determined if water is present within the electronic power steering assembly from the amplitude of the output of the first series RC network. If so (Y), an alert is provided to a driver at 714. Otherwise, the method returns to 702 to continue monitoring the electronic power steering system for the ingress of water.

In one example, a signal representing a difference between the amplitude of the output of the first series RC network and the amplitude of the output of the second series RC network is generated, for example, at a difference amplifier. In this example, both the presence of water and the integrity of the monitoring can be determined from the difference signal via appropriate decision logic. For example, the ingress of water into the electronic steering system should result in a persistent decrease of the gain of the first series RC circuit relative to the second series RC circuit. A detection of this decrease, for example, as a series of windowed averages of the difference signal that meet a given threshold value, can result in a determination that water is present. Otherwise, the difference value should remain near zero. Detection of patterns in the difference signal that differ from these two scenarios can be determined to result from errors in the system. In one example, a rule-based expert system can be employed to monitor the difference signal for both ingress of water into the electronic steering system as well as errors.

Implementation of the techniques, blocks, steps, and means described above can be done in various ways. For example, these techniques, blocks, steps, and means can be implemented in hardware, software, or a combination thereof. For a hardware implementation, the processing units can be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described above, and/or a combination thereof.

Also, it is noted that the embodiments can be described as a process which is depicted as a flowchart, a flow diagram, a data flow diagram, a structure diagram, or a block diagram. Although a flowchart can describe the operations as a sequential process, many of the operations can be performed in parallel or concurrently. In addition, the order of the operations can be re-arranged. A process is terminated when its operations are completed, but could have additional steps not included in the figure. A process can correspond to a method, a function, a procedure, a subroutine, a subprogram, etc. When a process corresponds to a function, its termination corresponds to a return of the function to the calling function or the main function.

Furthermore, embodiments can be implemented by hardware, software, scripting languages, firmware, middleware, microcode, hardware description languages, and/or any combination thereof. When implemented in software, firmware, middleware, scripting language, and/or microcode, the program code or code segments to perform the necessary tasks can be stored in a machine readable medium such as a storage medium. A code segment or machine-executable instruction can represent a procedure, a function, a subprogram, a program, a routine, a subroutine, a module, a software package, a script, a class, or any combination of instructions, data structures, and/or program statements. A code segment can be coupled to another code segment or a hardware circuit by passing and/or receiving information, data, arguments, parameters, and/or memory contents. Information, arguments, parameters, data, etc. can be passed, forwarded, or transmitted via any suitable means including memory sharing, message passing, ticket passing, network transmission, etc.

For a firmware and/or software implementation, the methodologies can be implemented with modules (e.g., procedures, functions, and so on) that perform the functions described herein. Any machine-readable medium tangibly embodying instructions can be used in implementing the methodologies described herein. For example, software codes can be stored in a memory. Memory can be implemented within the processor or external to the processor. As used herein the term "memory" refers to any type of long term, short term, volatile, nonvolatile, or other storage medium and is not to be limited to any particular type of memory or number of memories, or type of media upon which memory is stored.

Moreover, as disclosed herein, the term "storage medium" can represent one or more memories for storing data, including read only memory (ROM), random access memory (RAM), magnetic RAM, core memory, magnetic disk storage mediums, optical storage mediums, flash memory devices and/or other machine readable mediums for storing information. The term "machine-readable medium" includes, but is not limited to portable or fixed storage devices, optical storage devices, wireless channels, and/or various other storage mediums capable of storing that contain or carry instruction(s) and/or data.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on.

What is claimed is:

1. A system for detecting water within an electronic power steering assembly comprising:
   a sensor assembly comprising a resistor and a water-sensitive capacitor arranged to provide a series resistor-capacitor (RC) network having a cut-off frequency that is a function of a capacitance of the water-sensitive capacitor, wherein the water-sensitive capacitor is configured to experience an increase in capacitance when water displaces another substance between conductive surfaces of the water-sensitive capacitor having a lower relative permittivity;

an oscillator that provides an excitation to the series RC network having a known frequency, the series RC network providing an output in response to the excitation;

an envelope detector that receives the output of the series RC network and generates an output representing an amplitude of the output of the series RC network; and a microcontroller that determines if water is present within the electronic power steering assembly from the amplitude of the output of the series RC network.

2. The system of claim 1, wherein the cut-off frequency of the series RC network varies between a first value and a second value, and the excitation frequency of the excitation is selected to be greater than the lesser of the first value and the second value.

3. The system of claim 1, wherein the resistor is a first resistor, the cut-off frequency is a first cut-off frequency, and the series RC network is a first series RC network, and the envelope detector is a first envelope detector, the system further comprising a reference circuit comprising a second resistor, the first resistor and the second resistor having substantially the same resistance, and a capacitor, having a fixed capacitance, arranged to provide a second series RC network, having a second cut-off frequency that is not expected to vary with the presence of water within the electronic power steering system, that receives the excitation from the oscillator, the second series RC network providing an output in response to the excitation from the oscillator.

4. The system of claim 3, wherein the first cut-off frequency varies between a first value, representing an absence of water at the sensor assembly, and a second value, representing the presence of water at the sensor assembly, the capacitor having the fixed capacitance being selected such that the second cut-off frequency is substantially equal to the first value.

5. The system of claim 3, the reference circuit further comprising a second envelope detector that receives the output of the second series RC network and provides an output representing the amplitude of the output of the second series RC network, and the system further comprising a difference amplifier that receives the output of the first envelope detector and the output of the second envelope detector and generates a difference signal representing a difference in the amplitude of the first series RC network and the amplitude of the second series RC network, the difference signal being provided to the microcontroller.

6. The system of claim 3, wherein the microcontroller comprises:

an analog-to-digital converter that produces a digital signal representing difference in the amplitude of the first series RC network and the amplitude of the second series RC network from the difference signal; and decision logic that determines if the sensor assembly is operating within specification and, when it is determined that the sensor assembly is operating within specification, determines if water is present within the electronic power steering assembly.

7. The system of claim 3, the reference circuit further comprising a second envelope detector that receives the output of the second series RC network and provides an output representing the amplitude of the output of the second series RC network, and the microcontroller comprising:

an analog-to-digital converter that produces a first digital signal representing the amplitude of the first series RC network from the output of the first envelope detector and a second digital signal representing the amplitude of the second series RC network from the output of the second envelope detector; and first decision logic that determines if the sensor assembly is operating within specification from the second digital signal; and second decision logic that determines if water is present within the electronic power steering assembly when the sensor assembly is operating within specification.

8. The system of claim 1, wherein the oscillator is located at the microcontroller.

9. The system of claim 1, wherein the oscillator is located at the sensor assembly.

10. The system of claim 1, wherein the sensor assembly is located at a lowest point in an internal cavity of a ball nut assembly associated with the electronic power steering assembly.

11. The system of claim 1, wherein the sensor assembly is a first sensor assembly, the resistor is a first resistor, and the water-sensitive capacitor is a first water-sensitive capacitor, the system further comprising a second sensor assembly comprising a second water-sensitive capacitor and a second resistor arranged to provide an oscillating circuit that provides an output having a first frequency when water is present at the second water-sensitive capacitor and a second frequency when water is not present at the second water-sensitive capacitor.

12. A method comprising:

providing an excitation, having a known frequency, to a series RC network, comprising a water-sensitive capacitor and positioned within an electronic power steering assembly, the series RC network providing an output in response to the excitation and being configured such that a difference between a first gain of the series RC network when no water is present at the water-sensitive capacitor and a second gain of the series RC network when water is present at the water-sensitive capacitor is maximized at the excitation frequency;

generating, from the output of the series RC network, an output representing an amplitude of the output of the series RC network; and determining if water is present within the electronic power steering assembly from the amplitude of the output of the series RC network.

13. The method of claim 12, wherein the series RC network is a first series RC network and the method further comprises:

providing the excitation to a second series RC network having a capacitor with a substantially constant capacitance;

generating, from the output of the second series RC network, an output representing an amplitude of the output of the second series RC network; and determining if the output of the first series RC network is valid from the output of the second series RC network.

14. The method of claim 13, further comprising:

generating a signal representing a difference between the amplitude of the output of the first series RC network and the amplitude of the output of the second series RC network;

wherein determining if water is present within the electronic power steering assembly from the amplitude of the output of the series RC network comprises determining if water is present within the electronic power steering assembly from the signal representing the difference between the amplitude of the output of the first series RC network and the amplitude of the output of the second series RC network.

15. The method of claim 12, wherein the series RC network is configured such that the excitation frequency is at least the cut-off frequency of the series RC network when no water is present at the water-sensitive capacitor.

16. A method comprising:
providing an excitation, having a known frequency, to a first series RC network, comprising a water-sensitive capacitor and positioned within an electronic power steering assembly, and a second series RC network, comprising a capacitor with a substantially constant capacitance, each of the first series RC network and the second series RC network providing respective outputs in response to the excitation;
generating, from the output of the first series RC network, an output representing an amplitude of the output of the first series RC network;
generating, from the output of the second series RC network, an output representing an amplitude of the output of the second series RC network;
determining if the output of the first series RC network is valid from the output of the second series RC network; and
determining if water is present within the electronic power steering assembly from the amplitude of the output of the first series RC network.

17. The method of claim 16, further comprising generating a signal representing a difference between the amplitude of the output of the first series RC network and the amplitude of the output of the second series RC network, wherein determining if water is present within the electronic power steering assembly from the amplitude of the output of the series RC network comprises determining if water is present within the electronic power steering assembly from the signal representing the difference between the amplitude of the output of the first series RC network and the amplitude of the output of the second series RC network, and determining if the output of the first series RC network is valid from the output of the second series RC network comprises determining if the output of the first series RC network is valid from the signal representing the difference between the amplitude of the output of the first series RC network and the amplitude of the output of the second series RC network.

* * * * *